United States Patent
Kim et al.

(10) Patent No.: US 9,130,123 B2
(45) Date of Patent: Sep. 8, 2015

(54) LIGHT EMITTING DEVICE AND LIGHT EMITTING DEVICE PACKAGE

(75) Inventors: Sun Kyung Kim, Yongin-si (KR); Jin Wook Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 155 days.

(21) Appl. No.: 12/793,781

(22) Filed: Jun. 4, 2010

(65) Prior Publication Data
US 2011/0068355 A1    Mar. 24, 2011

(30) Foreign Application Priority Data
Sep. 23, 2009  (KR) .................. 10-2009-0089902

(51) Int. Cl.
*H01L 33/00* (2010.01)
*H01L 33/38* (2010.01)
*H01L 33/42* (2010.01)

(52) U.S. Cl.
CPC ............... *H01L 33/38* (2013.01); *H01L 33/42* (2013.01)

(58) Field of Classification Search
CPC ........ H01L 33/38; H01L 33/405; H01L 33/42
USPC .............. 257/94, 99, E33.023, E33.005, 257/E33.003, E33.064; 438/29, 32
See application file for complete search history.

(56) References Cited

U.S. PATENT DOCUMENTS

| 6,420,732 B1 | 7/2002 | Kung et al. |
| 6,495,862 B1 | 12/2002 | Okazaki et al. |
| 6,720,584 B2 * | 4/2004 | Hata et al. ............ 257/98 |
| 6,903,374 B2 | 6/2005 | Katayama |
| 6,977,395 B2 | 12/2005 | Yamada et al. |
| 7,652,295 B2 | 1/2010 | Cho et al. |
| 7,687,822 B2 | 3/2010 | Nagai et al. |
| 7,763,898 B2 | 7/2010 | Tanaka et al. |
| 7,893,451 B2 | 2/2011 | Cho et al. |
| 7,939,840 B2 | 5/2011 | Cho et al. |
| 8,003,993 B2 | 8/2011 | Cho et al. |
| 8,076,688 B2 | 12/2011 | Kim et al. |
| 8,101,964 B2 | 1/2012 | Kitagawa et al. |
| 8,120,057 B2 | 2/2012 | Sano et al. |
| 8,258,541 B2 | 9/2012 | Muraki et al. |
| 8,263,985 B2 | 9/2012 | Choi |
| 2004/0012013 A1 * | 1/2004 | Katayama ............ 257/13 |
| 2004/0046166 A1 | 3/2004 | Cho et al. |

(Continued)

FOREIGN PATENT DOCUMENTS

| CN | 1588652 | 3/2005 |
| CN | 1866569 | 11/2006 |

(Continued)

OTHER PUBLICATIONS

Korean Office Action dated Jun. 23, 2011. (10-2009-0089902).

(Continued)

*Primary Examiner* — Andy Huynh
*Assistant Examiner* — Sitaramarao S Yechuri
(74) *Attorney, Agent, or Firm* — Ked & Associates LLP (57) ABSTRACT

A light emitting device and a light emitting device package including the same are provided. The light emitting device may include a light emitting structure including a first conductive type semiconductor layer, an active layer, and a second conductive type semiconductor layer, a first electrode on the light emitting structure, the first electrode including a pattern, and a pad electrode on the first electrode.

7 Claims, 5 Drawing Sheets

(56) References Cited

U.S. PATENT DOCUMENTS

| | | | |
|---|---|---|---|
| 2005/0173714 A1 | 8/2005 | Lee et al. | |
| 2005/0173717 A1 | 8/2005 | Lee et al. | |
| 2005/0184297 A1* | 8/2005 | Hsieh | 257/79 |
| 2006/0192194 A1* | 8/2006 | Erchak et al. | 257/13 |
| 2006/0226429 A1 | 10/2006 | Sigalas | |
| 2006/0270206 A1 | 11/2006 | Cho et al. | |
| 2006/0284195 A1 | 12/2006 | Nagai | |
| 2007/0131941 A1 | 6/2007 | Tanaka et al. | |
| 2007/0181895 A1 | 8/2007 | Nagai | |
| 2007/0194336 A1* | 8/2007 | Shin et al. | 257/98 |
| 2007/0257269 A1 | 11/2007 | Cho et al. | |
| 2008/0017878 A1 | 1/2008 | Kuramoto | |
| 2008/0048194 A1 | 2/2008 | Kudo et al. | |
| 2008/0093612 A1 | 4/2008 | Konno et al. | 257/96 |
| 2008/0277679 A1 | 11/2008 | Akimoto | |
| 2009/0184329 A1* | 7/2009 | Miki et al. | 257/79 |
| 2009/0184334 A1 | 7/2009 | Lee et al. | 257/98 |
| 2009/0250716 A1 | 10/2009 | Haberern et al. | |
| 2009/0267105 A1 | 10/2009 | Yu et al. | |
| 2010/0051970 A1* | 3/2010 | Ouderkirk et al. | 257/88 |
| 2010/0171136 A1 | 7/2010 | Sakai et al. | 257/98 |
| 2010/0187559 A1 | 7/2010 | Han | |
| 2011/0018022 A1 | 1/2011 | Okabe et al. | |
| 2011/0049556 A1 | 3/2011 | Fujimoto et al. | |
| 2011/0204325 A1 | 8/2011 | Kim | |
| 2011/0241064 A1 | 10/2011 | Fang et al. | |
| 2012/0012874 A1 | 1/2012 | Morioka et al. | |
| 2012/0091499 A1 | 4/2012 | Kitagawa et al. | |
| 2012/0228658 A1 | 9/2012 | Sasaki et al. | |

FOREIGN PATENT DOCUMENTS

| | | |
|---|---|---|
| CN | 1993837 | 7/2007 |
| JP | 2001-156329 A | 6/2001 |
| JP | 2003-152221 A | 5/2003 |
| JP | 2007-287851 | 1/2007 |
| JP | 2008-103627 A | 5/2008 |
| KR | 10-2004-0008092 A | 1/2004 |
| KR | 10-2004-0022703 | 3/2004 |
| KR | 10-2005-0008035 | 1/2005 |
| KR | 10-2005-0008259 | 1/2005 |
| KR | 10-0648444 | 11/2006 |
| KR | 10-2007-0041506 | 4/2007 |
| KR | 10-2007-0043982 | 4/2007 |
| KR | 10-2007-0117336 A | 12/2007 |
| KR | 10-2008-0826375 B1 | 5/2008 |
| KR | 10-0847847 | 7/2008 |
| KR | 10-0850667 B1 | 7/2008 |
| KR | 10-2009-0053307 A | 5/2009 |
| KR | 10-2009-0119749 | 11/2009 |
| KR | 10-2010-0133997 | 12/2010 |
| WO | WO 2009/139524 | 11/2009 |

OTHER PUBLICATIONS

Korean Office Action dated Mar. 2, 2011. (10-2009-0089902).
Chinese Office Action dated May 24, 2012.
Chinese Office Action dated Nov. 15, 2012.
Korean Notice of Allowance dated Nov. 28, 2011.
U.S. Office Action issued in U.S. Appl. No. 12/893,710 dated Oct. 2, 2012.
European Search Report dated Oct. 27, 2014, issued in Application No. 10166575.0 (English translation).

\* cited by examiner

FIG. 9

LIGHT EMITTING DEVICE AND LIGHT EMITTING DEVICE PACKAGE

This application claims priority under 35 U.S.C. 119 to Korean Patent Application No. 10-2009-0089902, filed in Korea on Sep. 23, 2009, which is hereby incorporated by reference in its entirety.

BACKGROUND

1. Field

A light emitting device and a light emitting device package are disclosed herein.

2. Background

Light emitting devices are known. However, they suffer from various disadvantages.

BRIEF DESCRIPTION OF THE DRAWINGS

Embodiments will be described in detail with reference to the following drawings in which like reference numerals refer to like elements, and wherein.

DETAILED DESCRIPTION

Hereinafter, a light emitting device according to embodiments will be described with reference to the accompanying drawings. Where possible, like reference numerals have been used to indicate like elements.

In the following description, it should be understood that when a layer (or film) is referred to as being 'on' another layer or substrate, it may be directly on the another layer or substrate, or intervening layers may also be present. Further, it should be understood that when a layer is referred to as being 'under' another layer, it can be directly under the another layer, and one or more intervening layers may also be present. In addition, it should also be understood that when a layer is referred to as being 'between' two layers, it may be the only layer between the two layers, or one or more intervening layers may also be present.

Figure 1:
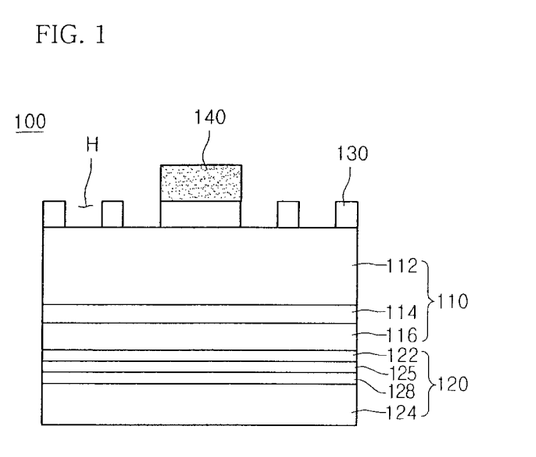
FIG. 1 is a sectional view of a light emitting device according to an embodiment.
Figure 2:
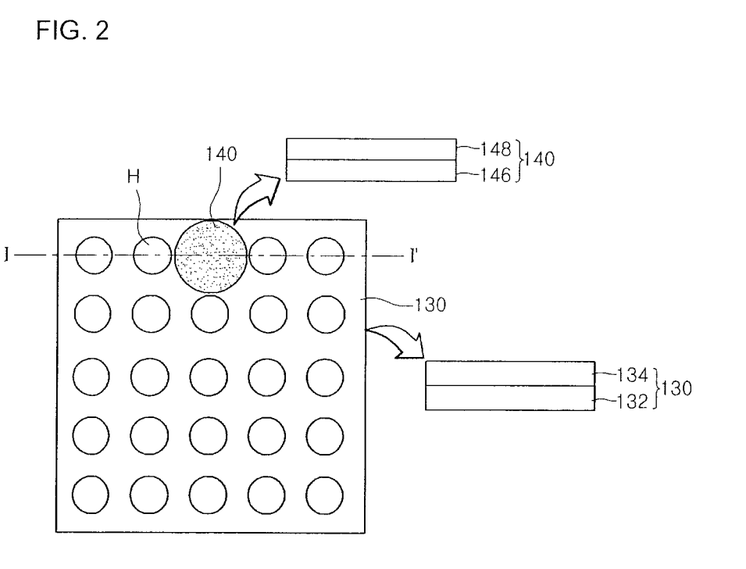
FIG. 2 is a plan view and a partially enlarged view of a light emitting device according to an embodiment.

FIG. 1 is a sectional view of a light emitting device according to an embodiment, and FIG. 2 is a plan view and a partially enlarged view of a light emitting device according to an embodiment. A light emitting device 100 according to an embodiment may include a light emitting structure 110, a first electrode 130, and a pad electrode 140. The light emitting structure 110 may include a first conductive type semiconductor layer 112, an active layer 114, and a second conductive type semiconductor layer 116. The first electrode 130 may include patterns H formed on the light emitting structure. The pad electrode 140 may be formed on the first electrode 130.

The first electrode 130 may include a first ohmic layer 132, and the first ohmic layer 132 may include a transparent ohmic layer; however, embodiments are not limited thereto. The first ohmic layer 132 may include the transparent ohmic layer and may have a thickness of about 20 nm or less; however, embodiments are not limited thereto. The first ohmic layer 132 may be formed, for example, of at least one of chromium (Cr), platinum (Pt), nickel (Ni), aurum (Au), and titanium (Ti).

In this embodiment, the first electrode 130 may have a structure in which an electrode metal may be deposited on an entire region of the light emitting structure 110 to form periodic or aperiodic patterns using, for example, a dry or wet etch process. According to one embodiment, the first electrode 130 may serve as a light extraction structure at the same time due to the periodic or aperiodic patterns within a planar metal layer.

According to one embodiment, since the first electrode 130 may be uniformly distributed on an upper end of the entire region of the light emitting structure 110, light may be uniformly emitted over a light emitting layer (the active layer). As a result, reliability of a high power LED may be improved.

In the related art, a n-type electrode may serve as only a reflective mirror. However, in this embodiment, the first electrode 130 may additionally perform a function in which a portion of light is extracted to the outside through the patterns H of a boundary of a metal/dielectric layer (an example of a material for filling the patterns).

Also, according to one embodiment, the patterns H formed on the boundary of the metal/dielectric may have good light extraction properties when compared to patterns formed on a boundary of a general dielectric. This is because the light extraction efficiency may be in proportion to a reflective index difference between two materials with a boundary therebetween.

Figure 3:
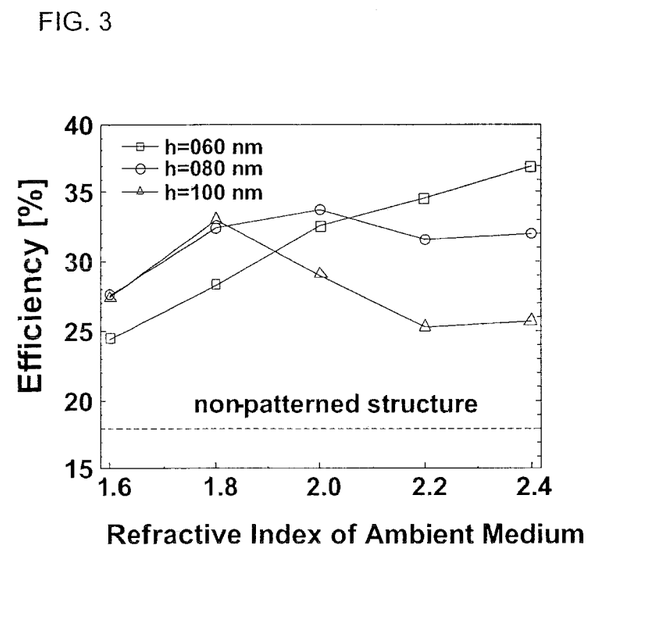
FIG. 3 is a chart illustrating light extraction efficiency of a light emitting device according to an embodiment.

FIG. 3 is a chart illustrating light extraction efficiency of a light emitting device according to an embodiment. For example, FIG. 3 illustrates a change of light extraction efficiency according to a reflective index and a pattern height h of a dielectric when patterns of about 400 nm are formed on a boundary of a metal/dielectric. The dotted line represents light extraction efficiency when patterns are not formed.

When light extraction efficiency due to patterns formed on a boundary between a metal and a dielectric of the first electrode 130 is calculated through an electromagnetics equation, it is clear that the light extraction efficiency significantly increases when compared to the existing light extraction efficiency (for example, about 18%). More specifically, a pattern height at which the light extraction efficiency is maximized according to a reflective index of an external dielectric may be varied.

In the light emitting device and the light emitting device package according to an embodiment, since the first electrode may include predetermined patterns within the planar metal layer, current diffusion may be easy, and simultaneously, the light extraction efficiency may be improved. Also, according to one embodiment, since the first electrode may include a thin transparent metal in a remaining region except in a location of a wire bonding pad, operation voltage characteristics may be satisfied, and also, light quantity may increase.

Figure 4:
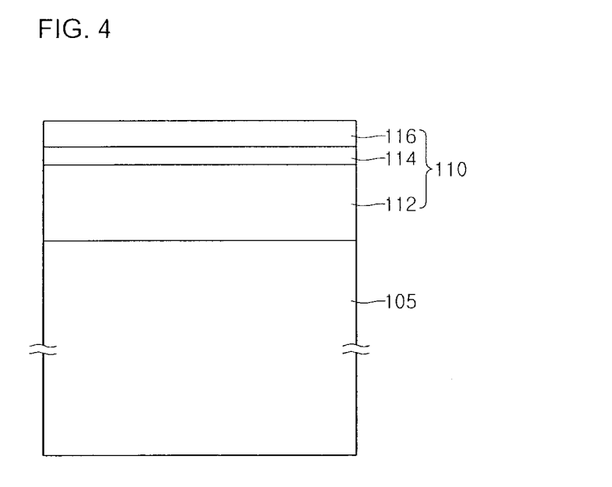
FIGS. 4 to 7 are sectional views illustrating a process of manufacturing a light emitting device according to an embodiment.

A method of manufacturing a light emitting device according to an embodiment will be described with reference to FIGS. 4 to 7. As shown in FIG. 4, a light emitting structure 110, which may include a first conductive type semiconductor layer 112, an active layer 114, and a second conductive type semiconductor layer 116 may be formed. As shown in FIG. 4, a first substrate 105 may be prepared. The first substrate 105 may include, for example, a sapphire ($Al_2O_3$) substrate and a SiC substrate; however, embodiments are not limited thereto. A wet cleaning process may be performed on the first substrate 105 to remove impurities from a surface of the first substrate 105.

Thereafter, the light emitting structure 110 including the first conductive type semiconductor layer 112, the active layer 114, and the second conductive type semiconductor layer 116 may be formed on the first substrate 105. In the first conductive type semiconductor layer 112, an N-type GaN layer may be formed using, for example, a chemical vapor deposition (CVD) process, molecular beam epitaxy (MBE) process, sputtering process, or hydrid vapour phase epitaxy process. Also, silane gas ($SiH_4$) containing n-type impurities, such as trimethyl gallium (TMGa) gas, ammonia ($NH_3$) gas, nitrogen ($N_2$) gas, and silicon (Si), may be injected into a chamber to form the first conductive type semiconductor layer 112.

In this embodiment, an undoped semiconductor layer (not shown) may be formed on the first substrate 105. The first conductive type semiconductor layer 112 may be formed on the undoped semiconductor layer to reduce a crystal lattice difference between the substrate and the light emitting structure.

The active layer 114 may serve as a layer in which electrons injected through the first conductive type semiconductor layer 112 recombine with electron holes injected through a second conductive type semiconductor layer 116 to emit light having an energy determined by a proper energy band of an active layer (a light emitting layer) material. The active layer 114 may have at least one of for example, a single quantum well structure, a multi-quantum well (MQW) structure, a quantum-wire structure, or a quantum dot structure. For example, in the active layer 114, trimethyl gallium (TMGa) gas, ammonia (NH3) gas, nitrogen (N2) gas, and trimethyl indium (TMIn) gas may be injected to form the multi-quantum well (MQW) structure having an InGaN/GaN structure or an InGaN/InGaN structure; however, embodiments are not limited thereto. In the second conductive type semiconductor layer 116, bis(ethylcyclopentadienyl) magnesium [$EtC_{p2}Mg$: $Mg(C_2H_5C_5H_4)_2$] containing p-type impurities, such as trimethyl gallium (TMGa) gas, ammonia ($NH_3$) gas, nitrogen ($N_2$) gas, and magnesium (Mg) gas may be injected into the chamber to form a p-type GaN layer; however, embodiments are not limited thereto.

Figure 5:
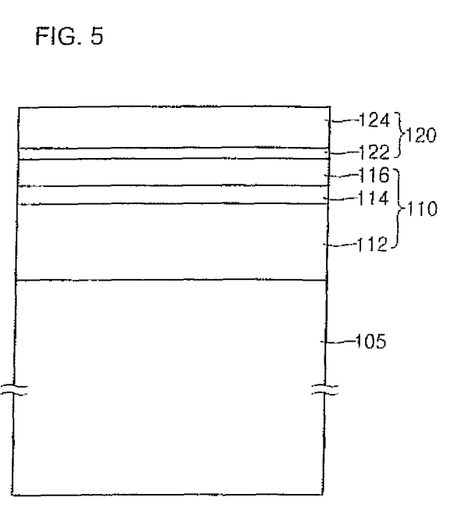

As shown in FIG. 5, a second electrode layer 120 may be formed on the second conductive type semiconductor layer 116. The second electrode layer 120 may include a second ohmic layer 122, a second reflective layer 125, a second coupling layer 128, and a second or conductive substrate 124, as shown in FIG. 1.

The second electrode layer 120 may include, for example, at least one of titanium (Ti), chromium (Cr), nickel (Ni), aluminium (Al), platinum (Pt), gold (Au), tungsten (W) or copper (Cu), a Cu alloy, Si, molybdenum (Mo), SiGe, Ge, $Ga_2O_3$, or GaN. For example, the second electrode layer 120 may include the second ohmic layer 122. Also, a single metal or a metal alloy and a metal oxide may be multi-stacked to improve the efficiency of electron hole injection. For example, the second ohmic layer 122 may be formed of at least one of ITO, ZnO, IZO(IN—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO; however, embodiments are not limited thereto.

Also, when the second electrode layer 120 includes the second reflective layer 125, the second electrode layer 120 may include a metal layer containing Al, Ag, or an alloy containing Al or Ag. Light generated in the active layer 114 may be effectively reflected by Al or Ag to significantly improve light extraction efficiency of the light emitting device. Additionally, when the second electrode layer 120 includes the second coupling layer 128, the second reflective layer 125 may serve as the second coupling layer 128, or the second coupling layer 128 may be formed using Ni or Au.

The second electrode layer 120 may include the second substrate 124. If the first conductive type semiconductor layer 112 has a sufficiently thick thickness, for example, a thickness of about 50 μm or more, a process of forming the second substrate 124 may be omitted. The second substrate 124 may be formed of a metal having good conductive properties, a metal alloy, or a conductive semiconductor material to efficiently inject the electron holes. For example, the second substrate 124 may be formed of one or more of copper (Cu), a Cu alloy, Si, molybdenum (Mo), SiGe, Ge, $Ga_2O_3$, or GaN. The second substrate 124 may be formed using, for example, an electrochemical metal deposition method or a bonding method using eutectic metals.

Figure 6:
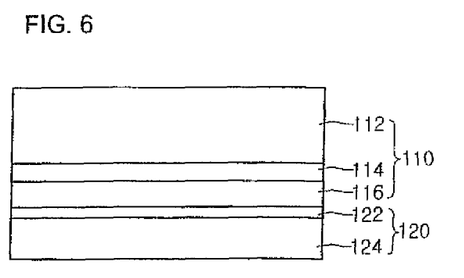

As shown in FIG. 6, the first substrate 105 may be removed to expose the first conductive type semiconductor layer 112. The first substrate 105 may be separated, for example, using a high power laser, or removed, for example, using a chemical etching process. Also, the first substrate 105 may be removed, for example, by being physically grinded.

Figure 7:
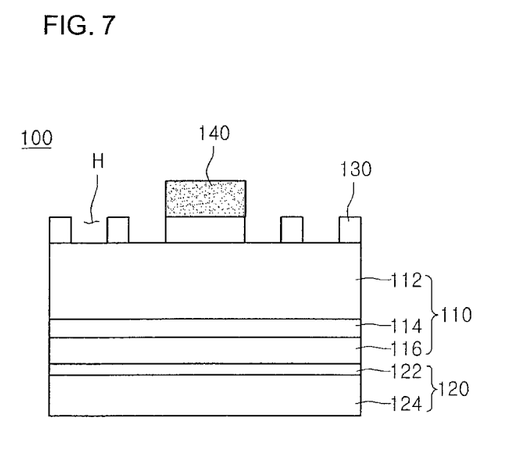

FIG. 7, a first electrode 130, which may include patterns H may be formed on the light emitting structure 110. A surface roughness (not shown) or a periodic surface structure (not shown) may be formed before the first electrode 130 is formed on the light emitting structure 110.

In a process of forming the first electrode 130 including the patterns H, a first electrode material (not shown) may be formed on the light emitting structure 110, and then, the first electrode material may be patterned using, for example, a wet or dry etch process to form the patterns H. The first electrode 130 which may define a region of a pad electrode 140 to be formed later, may have a wider area to correspond to the pad electrode 140; however, embodiments are not limited thereto. The process of forming the first electrode 130 may include forming a first ohmic layer 132 on the light emitting structure 110 and forming a first reflective layer 134 on the first ohmic layer 132, as shown in FIG. 2.

Figure 8:
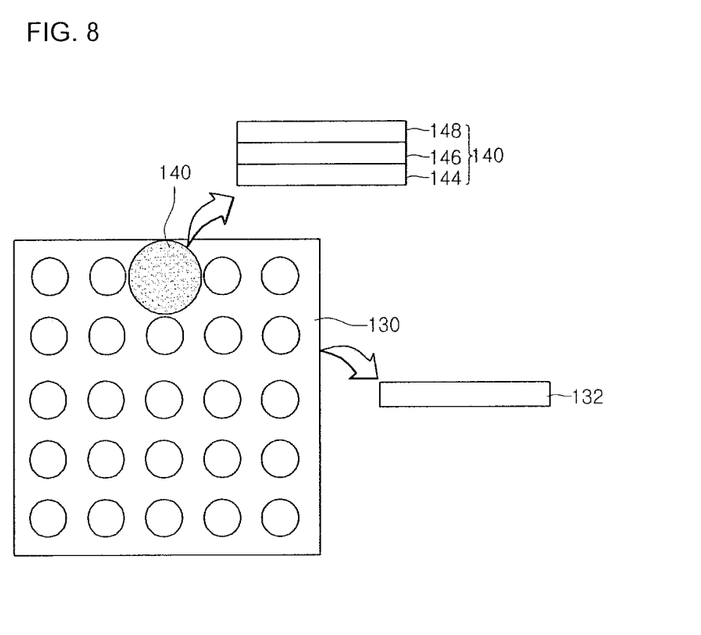
FIG. 8 is a plan view and a partially enlarged view of a light emitting device according to another embodiment.

FIG. 8 is a plan view and a partially enlarged view of a light emitting device according to another embodiment. According to this embodiment, a first electrode 130 may include a first ohmic layer 132, and the first ohmic layer 132 may include a transparent ohmic layer.

When the first ohmic layer 132 includes the transparent ohmic layer, the first ohmic layer 132 may have a thickness of about 20 nm or less. Also, the first ohmic layer 132 may be formed of one or more of Cr, Pt, Ni, Au, and Ti; however, embodiments are not limited thereto.

In this embodiment, the respective patterns H of the first electrode 130 may include, for example, a triangular lattice, a square lattice, or an Archimedean lattice using the same, or a quasicrystal. Also, the patterns H may include irregular random patterns in addition to the periodic patterns. Further, in this embodiment, the patterns H of the first electrode 130 may have a hole shape in which the patterns H are connected to each other to improve current diffusion. The patterns H applied in this embodiment may have a period ranging from about 100 nm to about 5,000 nm, and the first electrode 130 may occupy an area ranging from about 5% to about 95% of a total LED chip area.

In this embodiment, the patterns H may be filled with at least one or more of air, epoxy, or other dielectrics. When the patterns H are filled with a dielectric, the dielectric may have a reflective index of greater than approximately 1 and less than approximately 3. When the patterns H are filled with air, a photoresist or an insulating material may be formed in the pattern region and an additional material may be formed on the first electrode 130 to selectively remove the photoresist or the insulating material.

Thereafter, a pad electrode 140 may be formed on the first electrode 130. The pad electrode 140 may include a third coupling layer 146 for metal interface bonding and a bonding layer 148 for wire bonding to improve the current diffusion; however, embodiments are not limited thereto.

According to another embodiment, in the first electrode 130 including the patterns H, the bonding layer and the coupling layer may be omitted in a remaining region except for a region of the pad electrode 140, as shown in FIG. 2. For example, the first electrode 130 may include the first ohmic layer 132 and the first reflective layer 134, as shown in FIG. 2.

When the pad electrode 140 includes the third coupling layer 146, the third coupling layer 146 may be formed using Ni or Au. Also, the pad electrode 140 may include the bonding layer 148 due to Au.

Also, as shown in FIG. 8, the reflective layer may be omitted in the first electrode 130. For example, as shown in FIG. 8, when a metal of the first ohmic layer 132 is formed in the remaining region except the region of the pad electrode 140, the first ohmic layer 132 may have a thickness of about 20 nm or less to serve as a transparent metal layer. In this case, the pad electrode 140 may further include a third reflective layer 144 that reflects light. The third reflective layer 144 may include a metal layer containing Al, Ag, or an alloy containing Al or Ag.

In a light emitting device and a light emitting device package according to embodiments, since the first electrode may include predetermined patterns within the planar metal layer, current diffusion may be easy, and simultaneously, the light extraction efficiency may be improved. Also, according to embodiments, since the first electrode may include a thin transparent metal in a remaining region except for a location of a wire bonding pad, operation voltage characteristics may be satisfied, and also, light quantity may increase.

Figure 9:
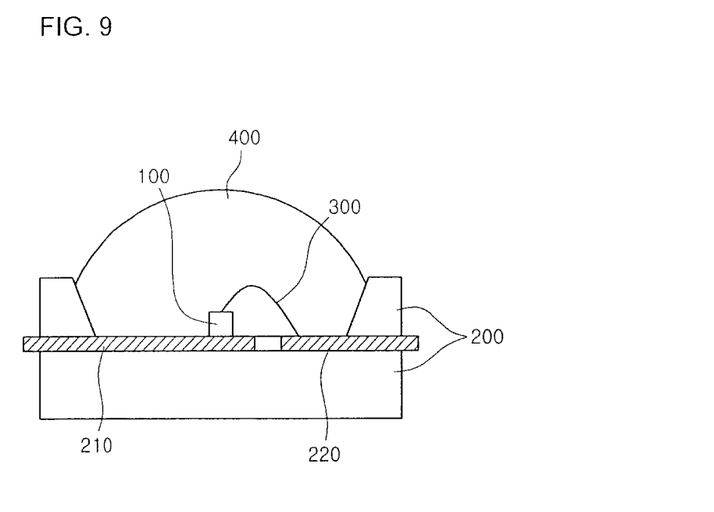
FIG. 9 is a sectional view of a light emitting device package according to embodiments.

FIG. 9 is a sectional view of a light emitting device package according to embodiments. Referring to FIG. 9, a light emitting device package according to embodiments may include a body 200, a third electrode layer 210 and a fourth electrode layer 220 formed in the body 200, a light emitting device 100 formed in the body 200 and electrically connected via a wire 300 to the third electrode layer 210 and the fourth electrode layer 220, and a molding member 400 that encapsulates the light emitting device 100.

The body 200 may be formed, for example, of a silicon material, a synthetic resin material, or a metal material. An inclined surface may be formed around the light emitting device 100.

The third electrode layer 210 and the fourth electrode layer 220 may be electrically separated from each other and supply a power to the light emitting device 100. Also, the third electrode layer 210 and the fourth electrode layer 220 may reflect light generated in the light emitting device 100 to improve light efficiency. In addition, the third electrode layer 210 and the fourth electrode layer 220 may release heat generated in the light emitting device 100 to the outside.

A vertical type light emitting device as illustrated in FIG. 1 may be applicable as the light emitting device 100 according to this embodiment; however, embodiments are not limited thereto. The light emitting device 100 may be formed on the package body 200 or on the third electrode layer 210 or the fourth electrode layer 220.

The light emitting device 100 may be electrically connected to the third electrode layer 210 and/or the fourth electrode layer 220 by, for example, a wire. In this embodiment, since a vertical type light emitting device 100 is used as an example, one wire 300 may be used. Alternatively, when the light emitting device 100 is a horizontal type light emitting device, two wires may be used. Also, when the light emitting device 100 includes a flip chip type light emitting device, the wire may not be necessary or used.

The molding member 400 may encapsulate the light emitting device 100 and protect the light emitting device 100. Also, a phosphor may be contained in the molding member 400 to vary a wavelength of light emitted from the light emitting device 100.

A light emitting device may be varied in light quantity or electrical characteristics, that is, an operation voltage according to an area or a configuration of an electrode, and as an area of the electrode increases, operation voltage characteristics may be improved, but the light quantity reduced.

Embodiments disclosed herein provide a light emitting device that may include an electrode to satisfy operation voltage characteristics and improve light quantity, a method of manufacturing the light emitting device, and a light emitting device package.

According to an embodiment disclosed herein, a light emitting device is provided that may include a light emitting structure including a first conductive type semiconductor layer, an active layer, and a second conductive type semiconductor layer; a first electrode on the light emitting structure, the first electrode comprising a pattern; and a pad electrode on the first electrode.

According to another embodiment disclosed herein, a light emitting device package is provided that may include a light emitting device including a light emitting structure, a first electrode on the light emitting structure, the first electrode including a pattern, and a pad electrode on the first electrode; and a package body, wherein the light emitting device is formed in the package body.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting package, comprising:
a light emitting device having a vertical-type light emitting diode structure, the light emitting device comprising:

a light emitting structure, comprising a first conductive type semiconductor layer, an active layer disposed on the first conductive type semiconductor layer, and a second conductive type semiconductor layer disposed on the active layer;

a first electrode disposed on the light emitting structure, wherein the first electrode comprises a pattern exposing a top surface of the light emitting structure and a remaining portion not exposing the top surface of the light emitting structure; and a pad electrode disposed on the first electrode; and a second electrode disposed under the light emitting structure, wherein the second electrode comprises a second ohmic layer under the light emitting structure, a second reflective layer under the second ohmic layer and a conductive substrate under the second reflective layer, wherein the second reflective layer vertically overlaps with the pattern of the first electrode, wherein the pad electrode comprises a reflective layer on a bottom surface thereof, wherein at least a portion of the remaining portion extends continuously along an outermost boundary of the top surface of the light emitting structure, wherein the pattern of the first electrode comprises a plurality of hole patterns, wherein the pad electrode is disposed between the plurality of hole patterns, wherein the pad electrode comprises a circular pattern, wherein the first electrode comprises a first portion that is overlapped with the pad electrode, and a lateral width of the first portion is the same as a lateral width of the pad electrode wherein the first electrode comprises a first ohmic layer and a first reflective layer on the first ohmic layer, wherein a pad region of the first electrode is formed so as to correspond to an area of the pad electrode on which the pattern is not formed, and wherein a bottom surface of the pad electrode directly contacts a top surface of the pad region of the first electrode, and wherein the pattern is formed within the first electrode.

2. The light emitting package of claim 1, wherein the light emitting package comprises
   a package body in which the light emitting device is disposed; and
   a plurality of electrode layers to which the light emitting device is electrically connected.

3. The light emitting package according to claim 1, wherein the pattern has a constant period.

4. The light emitting package according to claim 1, wherein the pattern has an irregular period.

5. The light emitting package of claim 1, wherein an area of the remaining portion not exposing the top surface of the light emitting structure is larger than an area of the pattern exposing a top surface of the light emitting structure.

6. The light emitting device of claim 1, wherein a top most surface of the pad electrode is higher than a top most surface of the first electrode.

7. The light emitting device of claim 1, wherein the first conductive type semiconductor layer comprises n-type impurities, and wherein the second conductive type semiconductor layer comprises p-type impurities.

* * * * *